(12) United States Patent
Shroff et al.

(10) Patent No.: US 9,231,077 B2
(45) Date of Patent: Jan. 5, 2016

(54) METHOD OF MAKING A LOGIC TRANSISTOR AND NON-VOLATILE MEMORY (NVM) CELL

(71) Applicants: Mehul D. Shroff, Austin, TX (US);
Mark D. Hall, Austin, TX (US)

(72) Inventors: Mehul D. Shroff, Austin, TX (US);
Mark D. Hall, Austin, TX (US)

(73) Assignee: FREESCALE SEMICONDUCTOR, INC., Austin, TX (US)

( * ) Notice: Subject to any disclaimer, the term of this patent is extended or adjusted under 35 U.S.C. 154(b) by 0 days.

(21) Appl. No.: 14/195,299

(22) Filed: Mar. 3, 2014

(65) Prior Publication Data
US 2015/0249140 A1 Sep. 3, 2015

(51) Int. Cl.
*H01L 21/338* (2006.01)
*H01L 29/66* (2006.01)
*H01L 29/40* (2006.01)
*H01L 21/3213* (2006.01)

(52) U.S. Cl.
CPC .... *H01L 29/66484* (2013.01); *H01L 21/32133* (2013.01); *H01L 21/32139* (2013.01); *H01L 29/401* (2013.01); *H01L 29/66545* (2013.01); *H01L 29/66833* (2013.01)

(58) Field of Classification Search
CPC .................................................. H01L 29/66484
USPC ....................................................... 438/167
See application file for complete search history.

(56) References Cited

U.S. PATENT DOCUMENTS

| | | |
|---|---|---|
| 5,614,746 A | 3/1997 | Hong et al. |
| 6,087,225 A | 7/2000 | Bronner et al. |
| 6,194,301 B1 | 2/2001 | Radens et al. |
| 6,235,574 B1 | 5/2001 | Tobben et al. |
| 6,333,223 B1 | 12/2001 | Moriwaki et al. |
| 6,388,294 B1 | 5/2002 | Radens et al. |
| 6,509,225 B2 | 1/2003 | Moriwaki et al. |
| 6,531,734 B1 | 3/2003 | Wu |
| 6,635,526 B1 | 10/2003 | Malik et al. |
| 6,707,079 B2 | 3/2004 | Satoh et al. |
| 6,777,761 B2 | 8/2004 | Clevenger et al. |
| 6,785,165 B2 | 8/2004 | Kawahara et al. |
| 6,939,767 B2 | 9/2005 | Hoefler et al. |

(Continued)

FOREIGN PATENT DOCUMENTS

WO 2009058486 5/2009

OTHER PUBLICATIONS

Notice Allowance mailed May 12, 2014 for U.S. Appl. No. 13/780,591 3 pages.
Notice of Allowance mailed Nov. 13, 2014 for U.S. Appl. No. 13/780,591 7 pages.
Non-Final Rejection mailed Dec. 26, 2014 for U.S. Appl. No. 13/661,157, 9 pages.
Restriction Requirement mailed Feb. 9, 2015 for U.S. Appl. No. 14/041,647 5 pages.
U.S. Appl. No. 14/228,682, filed Mar. 28, 2014, entitled "Method for Forming a Split-Gate Device".

(Continued)

*Primary Examiner* — Anthony Ho

(57) ABSTRACT

A method of forming a semiconductor device includes forming a first gate layer over a substrate in the NVM region and the logic region; forming an opening in the first gate layer in the NVM region; forming a charge storage layer in the opening; forming a control gate over the charge storage layer in the opening; patterning the first gate layer to form a first patterned gate layer portion over the substrate in the logic region and to form a second patterned gate layer portion over the substrate in the NVM region, wherein the second patterned gate layer portion is adjacent the control gate; forming a dielectric layer over the substrate around the first patterned gate layer portion and around the second patterned gate layer portion and the control gate, and replacing the first patterned gate layer portion with a logic gate comprising metal.

20 Claims, 6 Drawing Sheets

(56) References Cited

U.S. PATENT DOCUMENTS

| | | | |
|---|---|---|---|
| 7,154,779 B2 | 12/2006 | Mokhlesi et al. |
| 7,183,159 B2 | 2/2007 | Rao et al. |
| 7,190,022 B2 | 3/2007 | Shum et al. |
| 7,202,524 B2 | 4/2007 | Kim et al. |
| 7,208,793 B2 | 4/2007 | Bhattacharyya |
| 7,256,125 B2 | 8/2007 | Yamada et al. |
| 7,271,050 B2 | 9/2007 | Hill |
| 7,365,389 B1 | 4/2008 | Jeon et al. |
| 7,391,075 B2 | 6/2008 | Jeon et al. |
| 7,402,493 B2 | 7/2008 | Oh et al. |
| 7,405,968 B2 | 7/2008 | Mokhlesi et al. |
| 7,439,134 B1 | 10/2008 | Prinz et al. |
| 7,476,582 B2 | 1/2009 | Nakagawa et al. |
| 7,521,314 B2 | 4/2009 | Jawarani et al. |
| 7,524,719 B2 | 4/2009 | Steimle et al. |
| 7,544,490 B2 | 6/2009 | Ferrari et al. |
| 7,544,980 B2 | 6/2009 | Chindalore et al. |
| 7,544,990 B2 | 6/2009 | Bhattacharyya |
| 7,560,767 B2 | 7/2009 | Yasuda et al. |
| 7,795,091 B2 | 9/2010 | Winstead et al. |
| 7,799,650 B2 | 9/2010 | Bo et al. |
| 7,816,727 B2 | 10/2010 | Lai et al. |
| 7,821,055 B2 | 10/2010 | Loiko et al. |
| 7,906,396 B1 | 3/2011 | Chiang et al. |
| 7,932,146 B2 | 4/2011 | Chen et al. |
| 7,989,871 B2 | 8/2011 | Yasuda |
| 7,999,304 B2 | 8/2011 | Ozawa et al. |
| 8,017,991 B2 | 9/2011 | Kim et al. |
| 8,043,951 B2 | 10/2011 | Beugin et al. |
| 8,063,434 B1 | 11/2011 | Polishchuk et al. |
| 8,093,128 B2 | 1/2012 | Koutny et al. |
| 8,138,037 B2 | 3/2012 | Chudzik et al. |
| 8,168,493 B2 | 5/2012 | Kim |
| 8,298,885 B2 | 10/2012 | Wei et al. |
| 8,334,198 B2 | 12/2012 | Chen et al. |
| 8,372,699 B2 | 2/2013 | Kang et al. |
| 8,389,365 B2 | 3/2013 | Shroff et al. |
| 8,399,310 B2 | 3/2013 | Shroff et al. |
| 8,524,557 B1 | 9/2013 | Hall et al. |
| 8,536,006 B2 | 9/2013 | Shroff et al. |
| 8,536,007 B2 | 9/2013 | Hall et al. |
| 8,647,946 B2 | 2/2014 | Tan et al. |
| 8,679,927 B2 | 3/2014 | Ramkumar et al. |
| 2001/0049166 A1 | 12/2001 | Peschiaroli et al. |
| 2002/0061616 A1 | 5/2002 | Kim et al. |
| 2003/0022434 A1 | 1/2003 | Taniguchi et al. |
| 2004/0075133 A1 | 4/2004 | Nakagawa et al. |
| 2004/0262670 A1 | 12/2004 | Takebuchi et al. |
| 2005/0145949 A1 | 7/2005 | Sadra et al. |
| 2006/0038240 A1 | 2/2006 | Tsutsumi et al. |
| 2006/0046449 A1 | 3/2006 | Liaw |
| 2006/0099798 A1 | 5/2006 | Nakagawa |
| 2006/0134864 A1 | 6/2006 | Higashitani et al. |
| 2006/0211206 A1 | 9/2006 | Rao et al. |
| 2006/0221688 A1 | 10/2006 | Shukuri et al. |
| 2007/0037343 A1 | 2/2007 | Colombo et al. |
| 2007/0077705 A1 | 4/2007 | Prinz et al. |
| 2007/0115725 A1 | 5/2007 | Pham et al. |
| 2007/0215917 A1 | 9/2007 | Taniguchi |
| 2007/0224772 A1 | 9/2007 | Hall et al. |
| 2007/0249129 A1 | 10/2007 | Hall et al. |
| 2007/0264776 A1 | 11/2007 | Dong et al. |
| 2008/0029805 A1 | 2/2008 | Shimamoto et al. |
| 2008/0050875 A1 | 2/2008 | Moon et al. |
| 2008/0067599 A1 | 3/2008 | Tsutsumi et al. |
| 2008/0105945 A1 | 5/2008 | Steimle et al. |
| 2008/0121983 A1 | 5/2008 | Seong et al. |
| 2008/0128785 A1 | 6/2008 | Park et al. |
| 2008/0145985 A1 | 6/2008 | Chi |
| 2008/0185635 A1 | 8/2008 | Yanagi et al. |
| 2008/0237690 A1 | 10/2008 | Anezaki et al. |
| 2008/0237700 A1 | 10/2008 | Kim et al. |
| 2008/0283900 A1 | 11/2008 | Nakagawa et al. |
| 2008/0290385 A1 | 11/2008 | Urushido |
| 2008/0308876 A1 | 12/2008 | Lee et al. |
| 2009/0050955 A1 | 2/2009 | Akita et al. |
| 2009/0065845 A1 | 3/2009 | Kim et al. |
| 2009/0072274 A1 | 3/2009 | Knoefler et al. |
| 2009/0078986 A1 | 3/2009 | Bach |
| 2009/0101961 A1 | 4/2009 | He et al. |
| 2009/0111226 A1 | 4/2009 | Chindalore |
| 2009/0111229 A1 | 4/2009 | Steimle et al. |
| 2009/0179283 A1 | 7/2009 | Adams et al. |
| 2009/0225602 A1 | 9/2009 | Sandhu et al. |
| 2009/0256211 A1 | 10/2009 | Booth, Jr. et al. |
| 2009/0269893 A1 | 10/2009 | Hashimoto et al. |
| 2009/0273013 A1 | 11/2009 | Winstead et al. |
| 2009/0278187 A1 | 11/2009 | Toba |
| 2011/0031548 A1 | 2/2011 | White et al. |
| 2011/0095348 A1 | 4/2011 | Chakihara et al. |
| 2011/0204450 A1 | 8/2011 | Moriya |
| 2011/0260258 A1 | 10/2011 | Zhu et al. |
| 2012/0034751 A1 | 2/2012 | Ariyoshi et al. |
| 2012/0104483 A1 | 5/2012 | Shroff et al. |
| 2012/0132978 A1 | 5/2012 | Toba et al. |
| 2012/0142153 A1 | 6/2012 | Jeong |
| 2012/0248523 A1 | 10/2012 | Shroff et al. |
| 2012/0252171 A1 | 10/2012 | Shroff et al. |
| 2013/0026553 A1 | 1/2013 | Horch |
| 2013/0037886 A1 | 2/2013 | Tsai et al. |
| 2013/0065366 A1 | 3/2013 | Thomas et al. |
| 2013/0084684 A1 | 4/2013 | Ishii et al. |
| 2013/0137227 A1 | 5/2013 | Shroff et al. |
| 2013/0171785 A1 | 7/2013 | Shroff et al. |
| 2013/0171786 A1 | 7/2013 | Shroff et al. |
| 2013/0178027 A1 | 7/2013 | Hall et al. |
| 2013/0178054 A1 | 7/2013 | Shroff et al. |
| 2013/0264633 A1 | 10/2013 | Hall et al. |
| 2013/0264634 A1 | 10/2013 | Hall et al. |
| 2013/0267072 A1 | 10/2013 | Hall et al. |
| 2013/0267074 A1 | 10/2013 | Hall et al. |
| 2013/0323922 A1 | 12/2013 | Shen et al. |
| 2014/0035027 A1 | 2/2014 | Chakihara et al. |
| 2014/0050029 A1 | 2/2014 | Kang et al. |
| 2014/0120713 A1 | 5/2014 | Shroff et al. |

OTHER PUBLICATIONS

U.S. Appl. No. 13/441,426, Shroff, M. D., et al., Office Action—Allowance, mailed Jun. 9, 2014.

U.S. Appl. No. 13/491,771, Office Action mailed Mar. 6, 2014.

Chen, J.H., et al., "Nonvolatile Flash Memory Device Using Ge Nanocrystals Embedded in HfAlO High-k Tunneling and Control Oxides: Device Fabrication and Electrical Performance", IEEE Transactions on Electron Devices, vol. 51, No. 11, Nov. 2004, pp. 1840-1848.

Kang, T.K., et al., "Improved characteristics for Pd nanocrystal memory with stacked HfAlO-SiO2 tunnel layer", Sciencedirect.com, Solid-State Electronics, vol. 61, Issue 1, Jul. 2011, pp. 100-105, http://wwww.sciencedirect.com/science/article/pii/S0038110111000803.

Krishnan, S., et al., "A Manufacturable Dual Channel (Si and SiGe) High-K Metal Gate CMOS Technology with Multiple Oxides for High Performance and Low Power Applications", IEEE, Feb. 2011 IEEE International Electron Devices Meeting (IEDM), 28.1.1-28.1.4, pp. 634-637.

Lee, J.J., et al., "Theoretical and Experimental Investigation of Si Nanocrystal Memory Device with HfO2 High-K Tunneling Dielectric", IEEE Transactions on Electron Devices, vol. 50, No. 10, Oct. 2003, pp. 2067-2072.

Liu, Z., et al., "Metal Nanocrystal Memories—Part I: Device Design and Fabrication", IEEE Transactions on Electron Devices, vol. 49, No. 9, Sep. 2002, pp. 1606-1613.

Mao, P., et al., "Nonvolatile memory devices with high density ruthenium nanocrystals", Applied Physics Letters, vol. 93, Issue 24, Electronic Transport and Semiconductors, 2006.

Mao, P., et al., "Nonvolatile Memory Characteristics with Embedded high Density Ruthenium Nanocrystals", http://iopscience.iop.org/0256-307X/26/5/056104, Chinese Physics Letters, vol. 26, No. 5, 2009.

Pei, Y., et al., "MOSFET nonvolatile Memory with High-Density Cobalt-Nanodots Floating Gate and HfO2 High-k Blocking Dielectric", IEEE Transactions of Nanotechnology, vol. 10, No. 3, May 2011, pp. 528-531.

(56) References Cited

OTHER PUBLICATIONS

Wang, X.P., et al., Dual Metal Gates with Band-Edge Work Functions on Novel HfLaO High-K Gate Dielectric, IEEE, Symposium on VLSI Technology Digest of Technical Papers, 2006.
U.S. Appl. No. 13/402,426, Office Action—Allowance—May 3, 2013.
U.S. Appl. No. 13/789,971, Office Action—Allowance—May 15, 2013.
U.S. Appl. No. 13/491,771, Office Action—Rejection, Sep. 9, 2013.
U.S. Appl. No. 13/442,142, Office Action—Ex Parte Quayle, Apr. 4, 2013.
U.S. Appl. No. 13/442,142, Office Action—Allowance, Aug. 2, 2013.
U.S. Appl. No. 13/907,491, Office Action—Rejection, Sep. 3, 2013.
U.S. Appl. No. 12/915,726, Office Action—Restriction, Jul. 31, 2012.
U.S. Appl. No. 12/915,726, Office Action—Allowance, Dec. 10, 2012.
U.S. Appl. No. 13/781,727, Office Action—Rejection, Aug. 22, 2013.
U.S. Appl. No. 13/077,491, Office Action—Rejection, Aug. 15, 2012.
U.S. Appl. No. 13/077,491, Office Action—Rejection, Feb. 6, 2013.
U.S. Appl. No. 13/077,491, Office Action—Allowance, Jun. 18, 2013.
U.S. Appl. No. 13/077,501, Office Action—Allowance, Nov. 26, 2012.
U.S. Appl. No. 13/313,179, Office Action—Rejection, Aug. 15, 2013.
U.S. Appl. No. 13/307,719, Office Action—Allowance, May 29, 2013.
U.S. Appl. No. 13/343,331, Office Action—Rejection, Mar. 13, 2013.
U.S. Appl. No. 13/343,331, Office Action—Allowance, Jun. 24, 2013.
U.S. Appl. No. 13/441,426, Office Action—Allowance, Sep. 9, 2013.
U.S. Appl. No. 13/780,574, Office Action—Allowance, Sep. 6, 2013.
U.S. Appl. No. 13/491,760, Office Action—Allowance, Jul. 1, 2013.
U.S. Appl. No. 13/491,771, Hall, M., et al., "Integrating Formation of a Replacement Gate Transistor and a Non-Volatile Memory Cell Using a High-K Dielectric", filed Jun. 8, 2012.
U.S. Appl. No. 13/790,225, Hall, M., et al., "Integrating Formation of a Replacement Gate Transistor and a non-Volatile Memory Cell Having Thin Film Storage", filed Mar. 8, 2013.
U.S. Appl. No. 13/790,014, Hall, M., et al., "Integrating Formation of a Logic Transistor and a None-Volatile Memory Cell Using a Partial Replacement Gate Technique", filed Mar. 8, 2013.
U.S. Appl. No. 13/955,665, Perera, A.H., "Non-Volatile Memory (NVM) and High K and Metal Gate Integration Using Gate First Methodology", filed Jul. 31, 2013.
U.S. Appl. No. 14/041,591, Perera, A.H., "Non-Volatile Memory (NVM) and High K and Metal Gate Integration Using Gate Last Methodology", filed Sep. 30, 2013.
U.S. Appl. No. 13/971,987, Perera, A.H., et al., "Integrated Split Gate Non-Volatile Memory Cell and Logic Structure", filed Aug. 21, 2013.
U.S. Appl. No. 13/972,372, Perera, A.H., et al., "Integrated Split Gate Non-Volatile Memory Cell and Logic Device", filed Aug. 21, 2013.
U.S. Appl. No. 14/041,647, Perera, A.H., et al., "Non-Volatile Memory (NVM) and High-K and Metal Gate Integration Using Gate-First", filed Sep. 30, 2013.
U.S. Appl. No. 14/041,662, Perera, A. H., et al., "Non-Volatile Memory (NVM) and High-K and Metal Gate Integration Using Gate-Last Methodology", filed Sep. 30, 2013.
U.S. Appl. No. 13/962,338, Perera, A.H., "Nonvolatile Memory Bitcell With Inlaid High K Metal Select Gate", filed Aug. 8, 2013.
U.S. Appl. No. 13/973,433, Perera, A.H., et al., "Method to Form a Polysilicon Nanocrystal Thin Film Storage Bitcell Within a High K Metal Gate Platform Technology Using a Gate Last Process to Form Transistor Gates", filed Aug. 22, 2013.
U.S. Appl. No. 13/928,666, Hong, C. M., et al., "Non-Volatile Memory (NVM) and High Voltage Transistor Integration", filed Jun. 27, 2013.
U.S. Appl. No. 14/023,440, Baker, F.K., Jr., et al., "Non-Volatile Memory (NVM) Cell and High-K and Metal Gate Transistor Integration", filed Sep. 10, 2013.
U.S. Appl. No. 13/969,180, Perera, A.H., et al., "Non-Volatile Memory (NVM) Cell, High Voltage Transistor, and High-K and Metal Gate Transistor Integration", filed Aug. 16, 2013.
U.S. Appl. No. 13/973,549, Hong, C.M., et al., "Split-Gate non-Volatile Memory (NVM) Cell and Device Structure Integration", filed Aug. 22, 2013.
U.S. Appl. No. 13/780,591, Hall, M.D., et al., "Non-Volatile Memory (NVM) and Logic Integration", filed Feb. 28, 2013.
U.S. Appl. No. 13/491,760, Shroff, M.D., et al., "Integrating Formation of a Replacement Gate Transistor and a Non-Volatile Memory Cell Using an Interlayer Dielectric", filed Jun. 8, 2012.
U.S. Appl. No. 13/661,157, Shroff, M.D., et al., "Method of Making a Logic Transistor and a Non-Volatile Memory (NVM) Cell", file Oct. 26, 2012.
U.S. Appl. No. 13/781,727, Office Action—Restriction, Jun. 21, 2013.
U.S. Appl. No. 13/780,591, Office Action—Allowance, Nov. 22, 2013.
U.S. Appl. No. 13/928,666, Hong, Office Action—Rejection, mailed Jul. 23, 2014.
U.S. Appl. No. 14/041,662, Perera, Office Action—Restriction, mailed Aug. 1, 2014.
U.S. Appl. No. 13/969,180, Perera, Office Action—Allowance, mailed Aug. 5, 2014.
U.S. Appl. No. 13/781,727, Shroff, Office Action—Allowance, mailed Aug. 15, 2014.
U.S. Appl. No. 13/955,665, Office Action—Allowance, mailed Aug. 20, 2014.
U.S. Appl. No. 13/973,549, Hong, Office Action—Restriction, mailed Aug. 26, 2014.
U.S. Appl. No. 13/441,426, Shroff, Office Action—Allowance, mailed Sep. 26, 2014.
U.S. Appl. No. 13/661,157, Office Action—Restriction, mailed Oct. 2, 2014.
U.S. Appl. No. 14/041,662, Perera, Office Action—Allowance, mailed Oct. 17, 2014.
U.S. Appl. No. 13/790,225, Office Action—Allowance, Dec. 24, 2013.
U.S. Appl. No. 13/790,014, Office Action—Allowance, Dec. 24, 2013.
U.S. Appl. No. 13/442,142, Office Action—Allowance, Dec. 31, 2013.
U.S. Appl. No. 13/491,771, Office Action—Allowance, Jan. 16, 2014.
U.S. Appl. No. 13/781,727, Office Action—Allowance, Jan. 31, 2014.
U.S. Appl. No. 13/441,426, Office Action—Allowance, Feb. 21, 2014.
U.S. Appl. No. 13/442,142, Office Action—Allowance, Feb. 28, 2014.
U.S. Appl. No. 13/790,014, Office Action—Allowance, Mar. 3, 2014.
U.S. Appl. No. 13/907,491, Office Action—Allowance, Mar. 11, 2014.
U.S. Appl. No. 13/790,225, Office Action—Allowance, Mar. 12, 2014.
U.S. Appl. No. 13/781,727, Office Action—Allowance, May 12, 2014.
U.S. Appl. No. 13/343,331, Office Action—Allowance, Nov. 8, 2013.
Notice of Allowance mailed Apr. 24, 2015 for U.S. Appl. No. 13/661,157, 8 pages.
Notice of Allowance mailed Apr. 9, 2015 for U.S. Appl. No. 14/228,628, 9 pages.
Notice of Allowance mailed Jun. 10, 2015 for U.S. Appl. No. 14/041,647, 9 pages.

METHOD OF MAKING A LOGIC TRANSISTOR AND NON-VOLATILE MEMORY (NVM) CELL

BACKGROUND

1. Field

This disclosure relates generally to semiconductor manufacturing, and more specifically, to the making of logic transistors and NVM cells.

2. Related Art

Non-volatile memories (NVMs) are often formed on an integrated circuit which also performs other functions. In such cases it is undesirable to sacrifice logic performance in favor of performance of the NVM. Also, it is important to avoid or minimize additional cost in achieving high performance for both the logic and the NVM. Gate last, which is a technique for enhancing performance by using a dummy gate on, typically, thermal oxide for the formation of source/drains and then replacing the dummy gate and thermal oxide with a higher performance gate and gate dielectric has shown promise. The higher performance gate will typically have higher conductance and an optimized work function. The higher performance gate dielectric will typically have a higher dielectric constant (k) than oxide.

Accordingly there is a need to provide further improvement in achieving high performance while also addressing cost increase issues in integrated circuits that have both NVM and logic, particularly in the context of gate last.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

In one aspect, an NVM cell in an NVM region has its charge storage layer and control gate formed in an opening of a polysilicon layer and thermal oxide while a logic region, also having the polysilicon layer and thermal oxide, is protected. The control gate has a top surface that is metallic which may arise from forming an upper metallic layer or by the control gate comprising metal in its formation. The metallic top surface may either arise, for example, from siliciding the top surface of the control gate with a metal or by the control gate being formed from a layer that itself is metallic.

The semiconductor substrate described herein can be any semiconductor material or combinations of materials, such as gallium arsenide, silicon germanium, silicon-on-insulator (SOI), silicon, monocrystalline silicon, the like, and combinations of the above.

Figure 1:
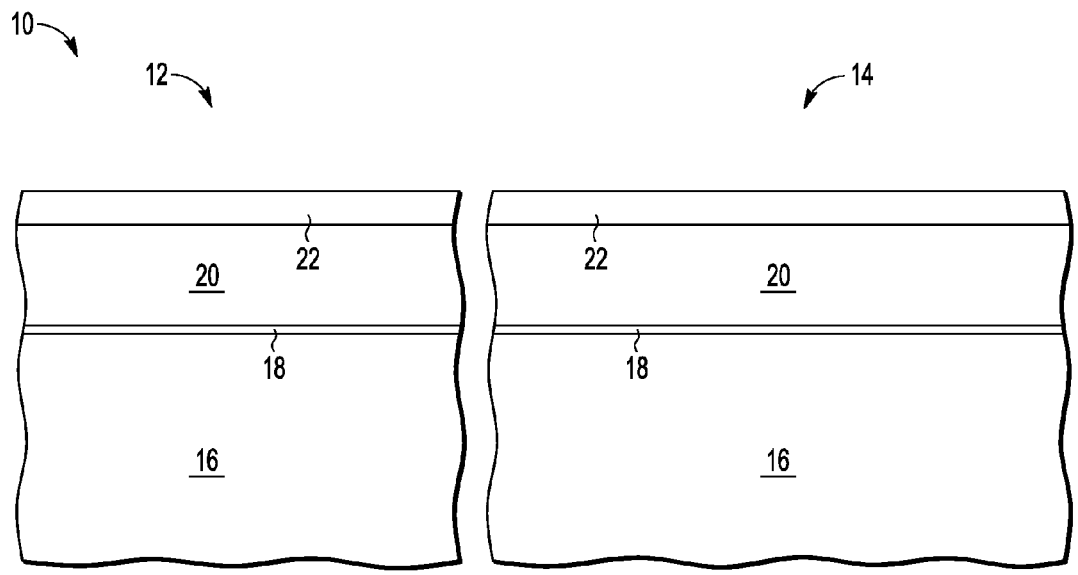
FIG. 1 is a cross section of a non-volatile memory cell and a gate last transistor at a stage in processing according to a first embodiment.

Shown in FIG. 1 is a semiconductor device 10 having a logic region 12 and an NVM region 14 with a substrate 16, an dielectric layer 18 that may be thermal oxide formed on substrate 16, a layer 20 of gate material that may be polysilicon formed on dielectric layer 18, and a hard mask 22 that may be nitride formed on layer 20. Dielectric layer 18 may be an oxynitride. Hard mask 22 is beneficial but may not be required in some situations.

Figure 2:
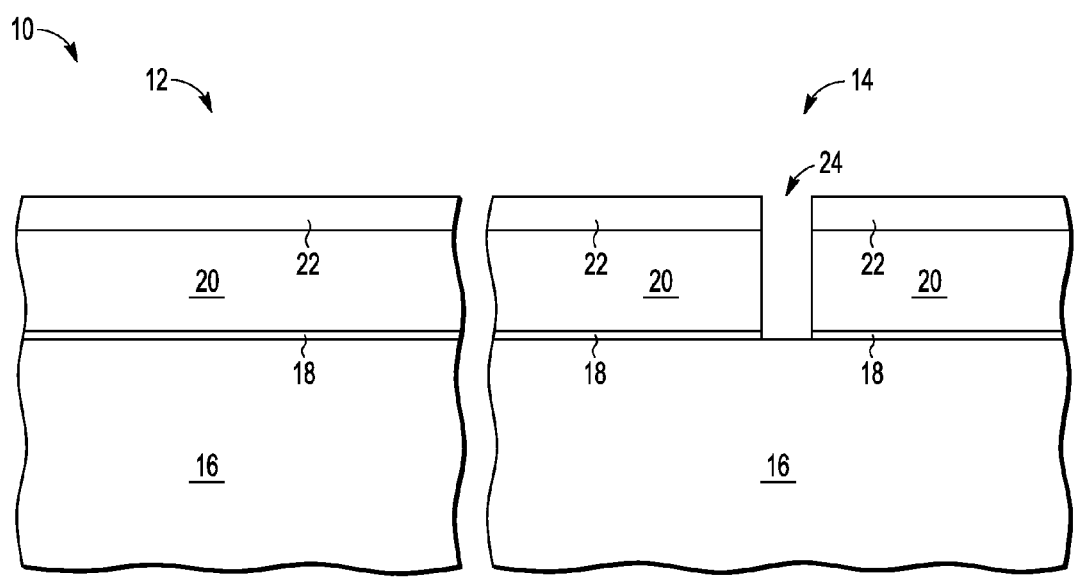
FIG. 2 is a cross section of a non-volatile memory cell and a gate last transistor of FIG. 1 at a subsequent stage in processing.

Shown in FIG. 2 is semiconductor device 10 after forming an opening 24 through hard mask 22, layer 20, and dielectric layer 18. Opening 24 is shown stopping at the top surface of substrate 16, but it may extend into substrate 16.

Figure 3:
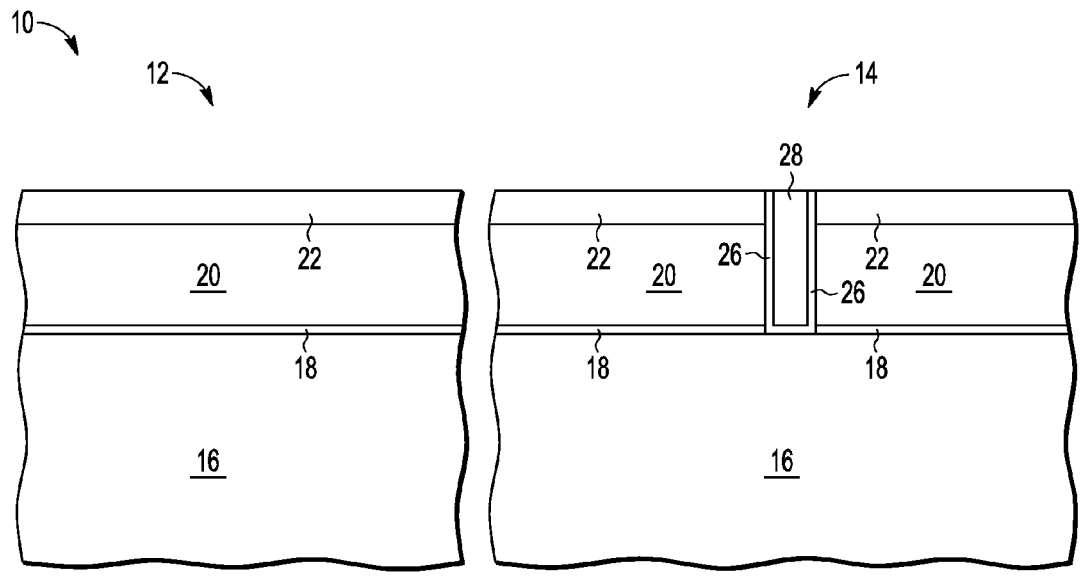
FIG. 3 is a cross section of a non-volatile memory cell and a gate last transistor of FIG. 2 at a subsequent stage in processing.

Shown in FIG. 3 is semiconductor device 10 after forming a charge storage layer 26 and a control gate 28 on charge storage layer 26 in opening 24. Charge storage layer 26 may be a layer of nanocrystals surrounded by an insulating material such as oxide and may be formed by bottom grown or deposited dielectric, silicon deposition and anneal that forms nanocrystals, and deposited top dielectric. This may be followed by depositing a layer of control gate material and performing a planarizing step that may be an etchback or chemical mechanical polishing (CMP).

Figure 4:
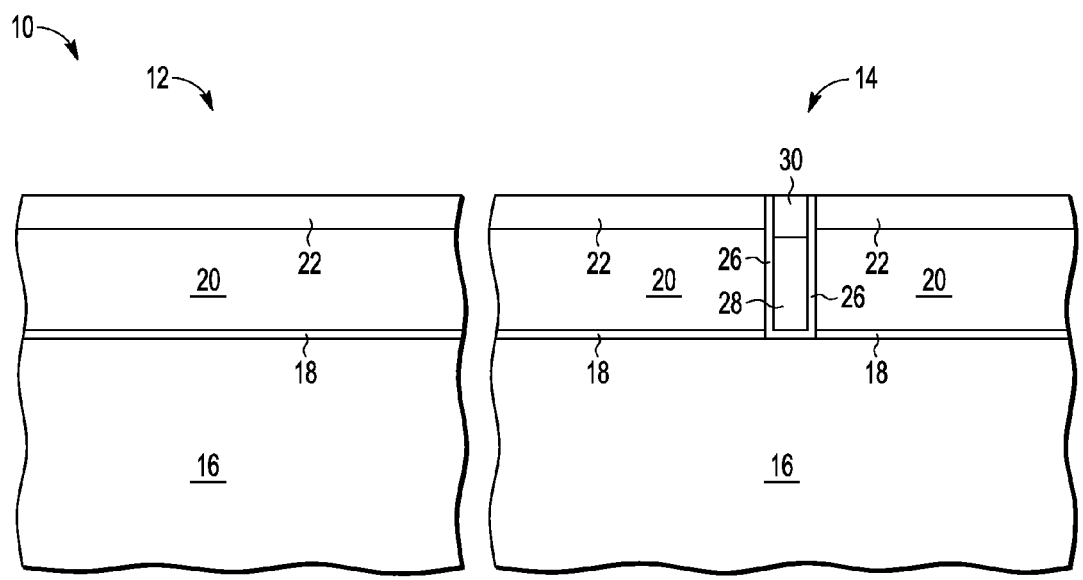
FIG. 4 is a cross section of a non-volatile memory cell and a gate last transistor of FIG. 3 at a subsequent stage in processing.

Shown in FIG. 4 is semiconductor device 10, for the case where control gate 28 is formed from polysilicon, after performing a silicidation step which results in a metal silicide 30 in a top layer of control gate 28. The silicidation step may be performed by applying a layer of nickel, applying heat to form nickel silicide on the top portion of control gate 28, and then removing the nickel that was not on polysilicon. If control gate 28 is formed from a layer that itself is metallic, the silicidation step is not needed. In either case, the result is that the top surface of control gate 28 is metallic. Control gate 28 thus has an etch selectivity to layer 20 either due to the surface of control gate being metallic or control gate 28 being entirely metallic.

Figure 5:
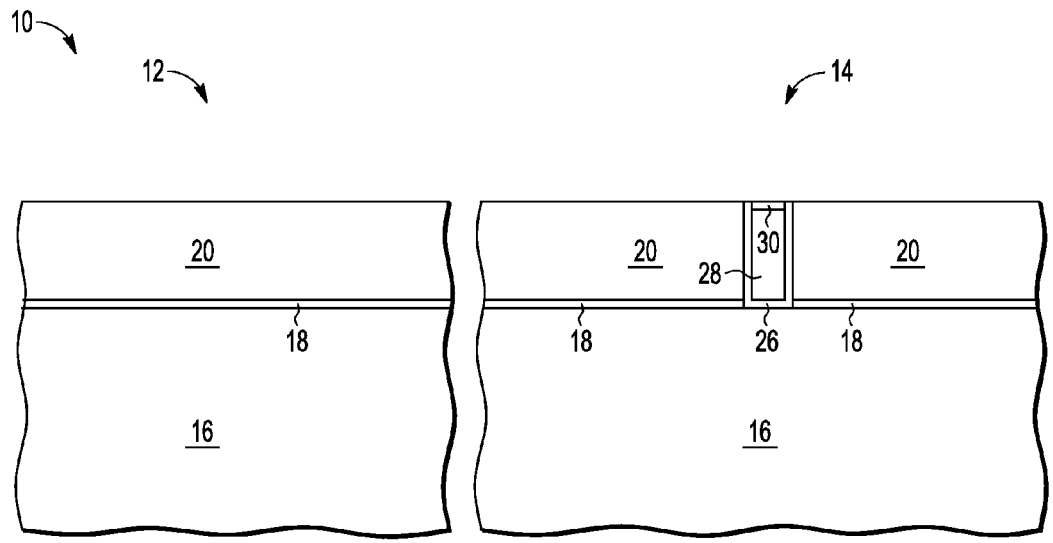
FIG. 5 is a cross section of a non-volatile memory cell and a gate last transistor of FIG. 4 at a subsequent stage in processing.

Shown in FIG. 5 is semiconductor device 10 after removing hard mask 22 and the top portion of metal silicide 30 to result in a planar top surface of metal silicide 30 with layer 20. Achieving the planarization may require CMP. It may be beneficial to leave hard mask 22 as a blocking layer for subsequent silicidation. Further, it may be feasible to postpone planarization until after metal gate formation even if hard mask 22 is removed at this point in the process.

Figure 6:
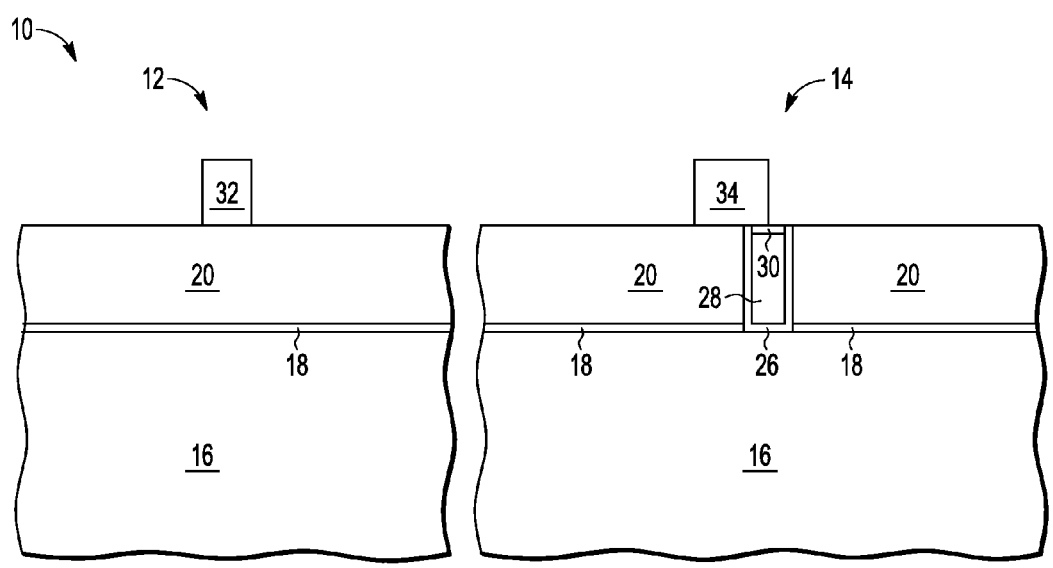
FIG. 6 is a cross section of a non-volatile memory cell and a gate last transistor of FIG. 5 at a subsequent stage in processing.

Shown in FIG. 6 is semiconductor device 10 after forming a photoresist mask pattern 32 on layer 20 in logic region 12 and a photoresist mask pattern 34 having a first edge over layer 20 spaced from a second edge that is over control gate 28. The location of the first edge is important in defining a select gate and thus may be considered a critical edge. The second edge should be over metal silicide 30 which gives it a relatively wide tolerance for being located properly. It may be beneficial to form mask patterns 32 and 34 in different steps.

Figure 7:
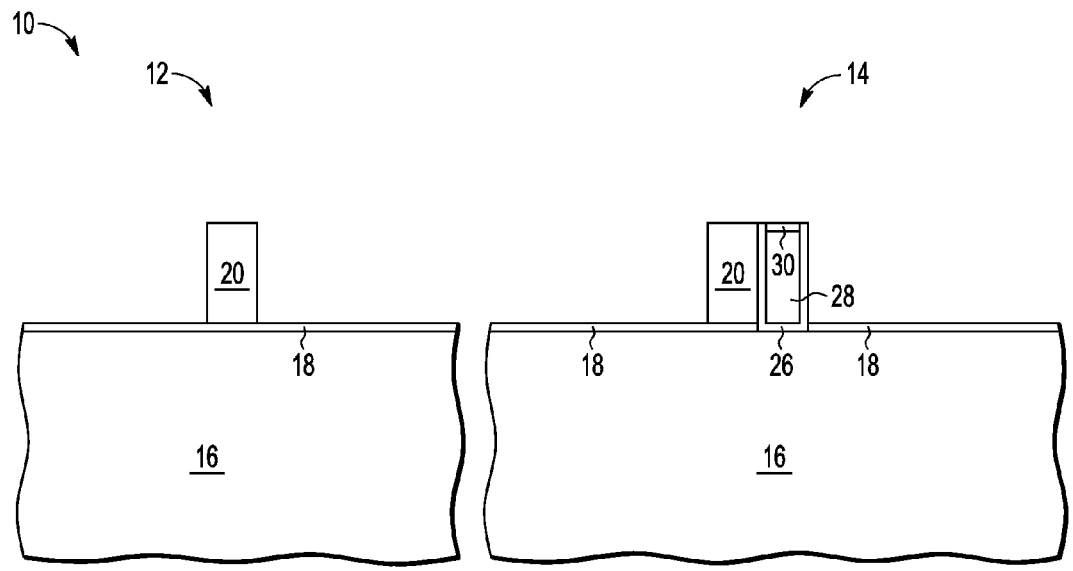
FIG. 7 is a cross section of a non-volatile memory cell and a gate last transistor of FIG. 6 at a subsequent stage in processing.

Shown in FIG. 7 is semiconductor device 10 after selectively removing layer 20 according to the photoresist mask patterns 32 and 34. Remaining layer 20 in logic region 12 will function as a dummy gate that will subsequently be replaced by a metal logic gate. Remaining layer 20 in NVM region 14 may be used as a select gate or may be used as a dummy gate to be replaced by a metal select gate. Dielectric layer 18 not covered by remaining portions of layer 20 is shown as not being removed but it could be removed at this point and in any event will be removed in subsequent sidewall spacer formation and associated processing.

Figure 8:
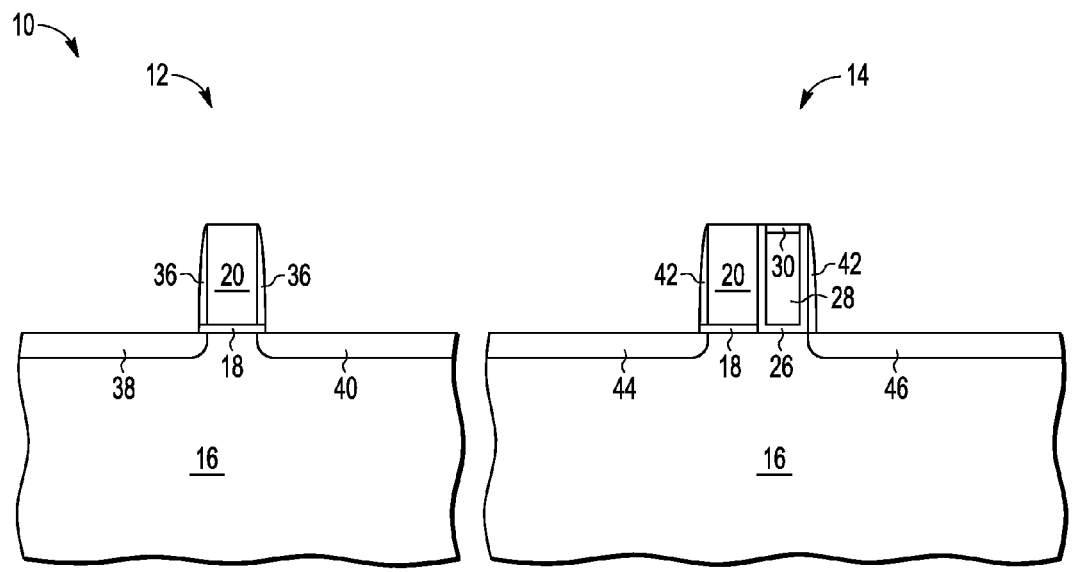
FIG. 8 is a cross section of a non-volatile memory cell and a gate last transistor of FIG. 7 at a subsequent stage in processing.

Shown in FIG. 8 is semiconductor device 10 after forming a sidewall spacer 36 around remaining layer 20 in logic region 12 and a sidewall spacer 42 around remaining layer 20 and control gate 28 in NVM region 14. Formed in substrate 16 are source/drain regions 38 and 40 on sides of remaining layer 20 in logic region 12, source/drain region 44 adjacent to remaining layer 20, and source/drain region 46 adjacent to control gate 28.

Figure 9:
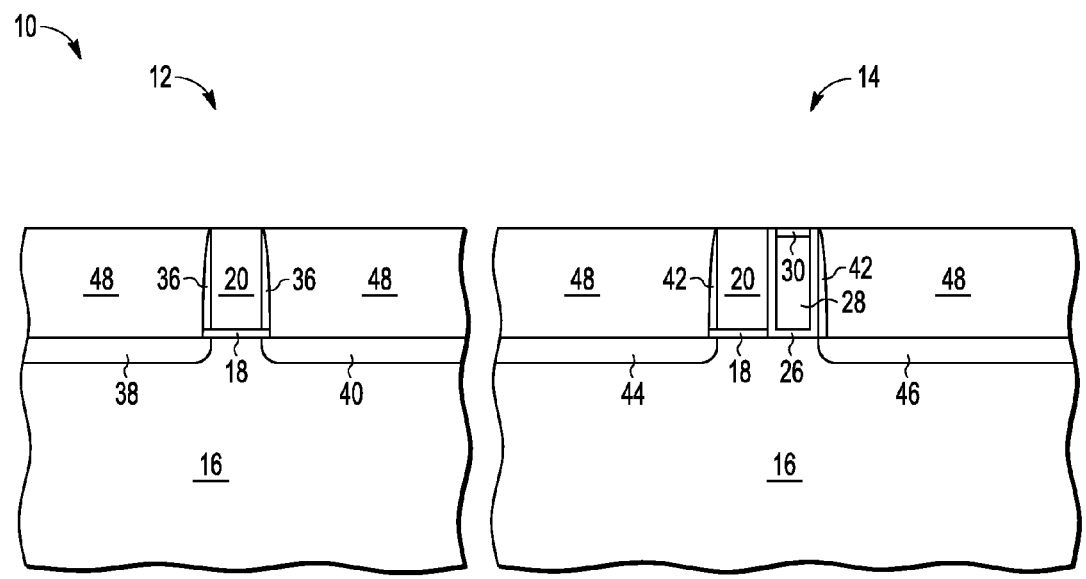
FIG. 9 is a cross section of a non-volatile memory cell and a gate last transistor of FIG. 8 at a subsequent stage in processing.

Shown in FIG. 9 is semiconductor device 10 after forming an interlayer dielectric (ILD) around remaining layers 20 in NVM region 14 and logic region 12. ILD 48 is planarized to be coplanar with top surfaces of remaining layers 20 and metal silicide 30. ILD 48 may be, for example, a low k material or an oxide.

Figure 10:
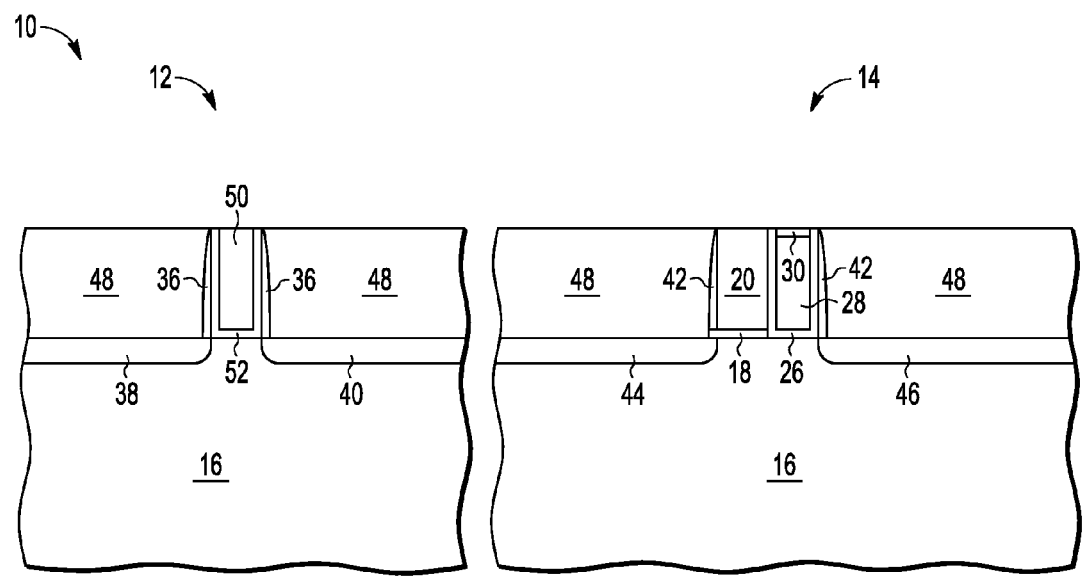
FIG. 10 is a cross section of a non-volatile memory cell and a gate last transistor of FIG. 9 at a subsequent stage in processing.

Shown in FIG. 10 is semiconductor device 10 after remaining layer 20 in logic region 12 and dielectric layer 18 are removed and replaced with a high-k dielectric layer 52 on substrate 10 and along the sides of sidewall spacer 36 and a metal logic gate 50 on high-k dielectric layer 52. This may complete formation of an NVM cell with remaining layer 20 in FIG. 10 adjacent to control gate 28 functioning as the select gate.

Figure 11:
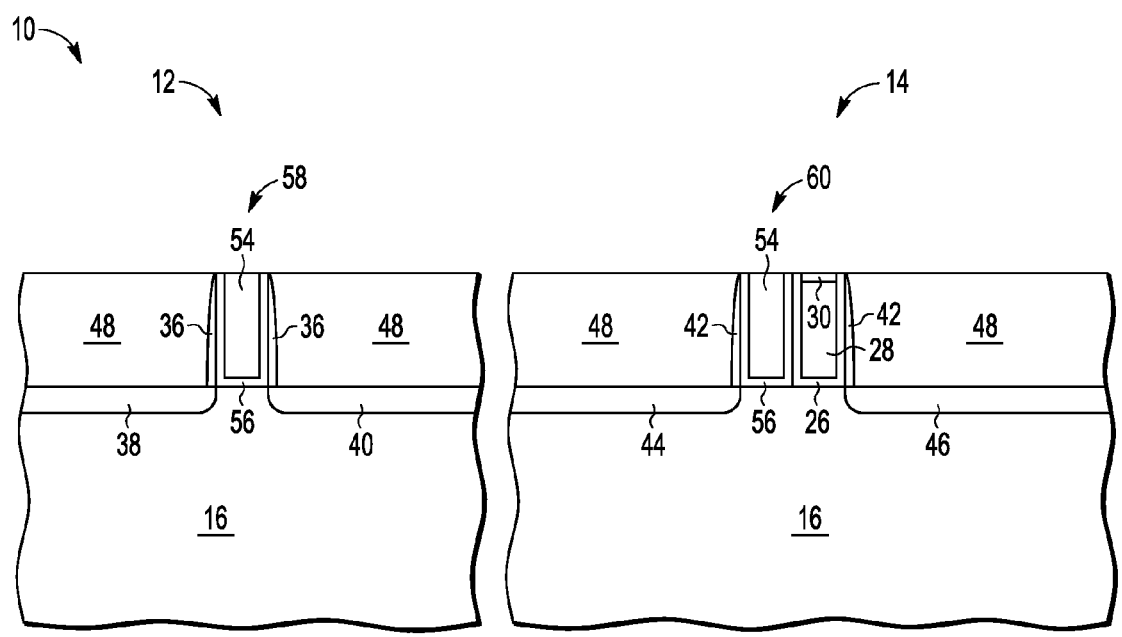
FIG. 11 is a cross section of a non-volatile memory cell and a gate last transistor of FIG. 9 at a subsequent stage in processing as an alternative to that shown in FIG. 10.

Shown in FIG. 11 is semiconductor device 10, as an alternative to semiconductor device 10 of FIG. 10, after replacing both remaining layers 20 with metal gates. In logic region 12, dielectric layer 18 is replaced with high-k dielectric 56 that is both on substrate 16 and along the sides of sidewall spacer 36 and remaining portion 20 is replaced by a metal 54 forming a metal logic gate 58. In NVM region 14, dielectric layer 18 is replaced with high-k dielectric 56 that is both on substrate 16 and along the side of sidewall spacer 42 and on charge storage layer 26 along the side of control gate 28, and remaining layer 20 is replaced by metal 54 forming a metal select gate 60 in NVM region 14. Small portions of dielectric layer 18 may remain under sidewall spacers 42 and 36. The metal gate replacement is beneficially performed simultaneously for the logic and NVM regions but this need not necessarily be the case. The logic regions and NVM regions could be separately optimized.

As shown, an integration of logic and NVM is efficiently achieved using a gate last process that provides a metal gate over high-k dielectric for the logic that allows for the option of using a metal gate for the control gate and the select gate.

By now it should be appreciated that there has been provided a method of forming a semiconductor device in an NVM region and in a logic region using a semiconductor substrate. The method includes forming a first gate layer over the semiconductor substrate in the NVM region and the logic region. The method further includes forming an opening in the first gate layer in the NVM region. The method further includes forming a charge storage layer in the opening. The method further includes forming a control gate over the charge storage layer in the opening, wherein the charge storage layer is between the control gate and a sidewall of the opening and between the control gate and the semiconductor substrate. The method further includes patterning the first gate layer to form a first patterned gate layer portion over the semiconductor substrate in the logic region and to form a second patterned gate layer portion over the semiconductor substrate in the NVM region, wherein the second patterned gate layer portion is adjacent the control gate. The method further includes forming a dielectric layer over the semiconductor substrate around the first patterned gate layer portion and around the second patterned gate layer portion and the control gate. The method further includes replacing the first patterned gate layer portion with a logic gate comprising metal. The method may have a further characterization by which the patterning the first gate layer includes forming a patterned masking layer over the first gate layer, wherein the patterned masking layer comprises a first patterned masking layer portion to define the second patterned gate layer portion, wherein a first edge of the first patterned masking layer portion is over the gate layer and a second edge of the first patterned masking layer portion is over one of the control gate or the charge storage layer, and removing portions of the gate layer using the first patterned masking layer portion. The method may have a further characterization by which the control gate comprises a metallic surface. The method may have a further characterization by which the patterned masking layer comprises a second patterned masking portion to define the first patterned gate layer portion. The method may have a further characterization by which the control gate has an etch selectivity to the first gate layer. The method may have a further characterization by which the patterning the gate layer further includes forming a second patterned masking layer over the first gate layer, wherein the second patterned masking layer comprises a second patterned masking portion to define the first patterned gate layer portion. The method may further include, after forming the control gate, siliciding a top portion of the control gate. The method may further include, prior to the siliciding, forming a hard mask layer over the gate layer, wherein the forming the opening in the gate layer is performed such that the opening is formed through the hard mask layer. The method may have a further characterization by which the gate layer comprises polysilicon. method may further include forming a gate dielectric layer over the semiconductor substrate, wherein the gate layer is formed over the gate dielectric layer, wherein the replacing the first patterned gate layer portion with a logic gate comprising metal includes removing the first patterned gate layer portion and the gate dielectric layer underlying the first patterned gate layer portion, and replacing the gate dielectric layer underlying the first patterned gate layer portion and the first patterned gate layer portion with a second gate dielectric having a high dielectric constant and the logic gate. The method may have a further characterization by which the forming the opening in the gate layer is performed such that the opening extends into the semiconductor substrate. The method may further include replacing the second patterned gate layer portion with a select gate comprising metal. The method may have a further characterization by which the replacing the first patterned gate layer portion includes. The method may further include removing the first patterned gate layer portion resulting in a second opening and the second patterned gate layer portion resulting in a third opening, forming a high-k dielectric layer in the second opening and the third opening, and forming a metal layer in the second opening and the third opening.

Also described is a method of forming a semiconductor device in an NVM region and in a logic region using a semiconductor substrate. The method includes forming a first gate layer over the semiconductor substrate in the NVM region and the logic region. The method further includes forming a control gate opening in the first gate layer in the NVM region. The method further includes forming a charge storage layer in the control gate opening. The method further includes forming a control gate over the charge storage layer in the control gate opening, wherein the charge storage layer is between the control gate and a sidewall of the control gate opening and between the control gate and the semiconductor substrate. The method further includes forming a first masking portion having a first edge over the first gate layer and a second edge over at least one of the control gate and the charge storage layer. The method further includes using the first masking portion to pattern the first gate layer to form a first gate layer portion over the semiconductor substrate in the NVM region adjacent the control gate. The method further includes forming a second masking portion over the first gate layer in the logic region. The method further includes using the second masking portion to pattern the first gate layer to form a second gate layer portion over the semiconductor substrate in the logic region. The method further includes forming a dielectric layer over the semiconductor substrate around the first gate layer portion and the control gate and around the second gate layer portion. The method further includes, after the forming the dielectric layer, removing the first gate layer portion resulting in a logic gate opening. The method further includes forming a metal logic gate in the logic gate opening. The method further includes, during the removing the first gate layer portion, removing the second gate layer portion resulting in a select gate opening and forming a metal select gate in the select gate opening. The method may have a further characterization by which the first masking portion and the second masking portion are part of the same patterned masking layer. The method may have a further characterization by which the control gate comprises a metallic surface.

Described also is a method of forming a semiconductor device in an NVM region and in a logic region using a semiconductor substrate. The method includes forming a first gate layer over the semiconductor substrate in the NVM region and the logic region. The method further includes forming a control gate opening in the first gate layer in the NVM region. The method further includes forming a charge storage layer in the control gate opening. The method further includes forming a control gate over the charge storage layer in the control gate opening, wherein the charge storage layer is between the control gate and a sidewall of the control gate opening and between the control gate and the semiconductor substrate. The method further includes patterning the first gate layer to form a first patterned gate layer portion over the semiconductor substrate in the logic region and to form a second patterned gate layer portion over the semiconductor substrate in the NVM region, wherein the second patterned gate layer portion is adjacent the control gate. The method further includes forming a dielectric layer over the semiconductor substrate around the first patterned gate layer portion and around the second patterned gate layer portion and the control gate. The method further includes, after the forming the dielectric layer, removing the first patterned gate layer portion to form a logic gate opening in the dielectric layer and removing the second patterned gate layer portion to form a select gate opening in the dielectric layer. The method further includes forming a metal layer in the logic gate opening and the select gate opening to form a logic gate in the logic gate opening and a select gate in the select gate opening. The method may further include forming a second dielectric layer over the semiconductor substrate, wherein the first gate layer is formed over second dielectric layer, and wherein the removing the first patterned gate layer portion to form the logic gate and the removing the second patterned gate layer portion to form the select gate opening comprises removing portions of the second dielectric layer with the first and second patterned gate layer potions, and forming a high-k dielectric layer in the logic gate opening and the select gate opening, wherein the metal layer is formed over the high-k dielectric layer. The method may have a further characterization by which the control gate comprises a metallic surface.

Although the invention is described herein with reference to specific embodiments, various modifications and changes can be made without departing from the scope of the present invention as set forth in the claims below. For example, remaining layer 20 in NVM region 14 may be silicided along with silicidation of logic and NVM active portions. This may be achieved by removing hard mask 22 over remaining layer 20 in NVM region 14 while leaving it on remaining layer 20 in logic region 12. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A method of forming a semiconductor device in a nonvolatile memory (NVM) region and in a logic region using a semiconductor substrate, comprising:
    forming a first gate layer over the semiconductor substrate in the NVM region and the logic region;
    forming an opening in the first gate layer in the NVM region;
    forming a charge storage layer in the opening;
    forming a control gate over the charge storage layer in the opening, wherein the charge storage layer is between the control gate and a sidewall of the opening and between the control gate and the semiconductor substrate;
    patterning the first gate layer to form a first patterned gate layer portion over the semiconductor substrate in the logic region and to form a second patterned gate layer portion over the semiconductor substrate in the NVM region, wherein the second patterned gate layer portion is adjacent the control gate;
    forming a dielectric layer over the semiconductor substrate, around the first patterned gate layer portion, around the second patterned gate layer portion, and around the control gate; and replacing the first patterned gate layer portion with a logic gate comprising metal.

2. The method of claim 1, wherein the patterning the first gate layer comprises:
forming a patterned masking layer over the first gate layer, wherein the patterned masking layer comprises a first patterned masking layer portion to define the second patterned gate layer portion, wherein a first edge of the first patterned masking layer portion is over the gate layer and a second edge of the first patterned masking layer portion is over one of the control gate or the charge storage layer; and
removing portions of the gate layer using the first patterned masking layer portion.

3. The method of claim 2, wherein the control gate has an etch selectivity to the first gate layer.

4. The method of claim 2, wherein the control gate comprises a metallic surface.

5. The method of claim 2, wherein the patterned masking layer comprises a second patterned masking portion to define the first patterned gate layer portion.

6. The method of claim 2, wherein the patterning the gate layer further comprises:
forming a second patterned masking layer over the first gate layer, wherein the second patterned masking layer comprises a second patterned masking portion to define the first patterned gate layer portion.

7. The method of claim 1, further comprising:
after forming the control gate, siliciding a top portion of the control gate.

8. The method of claim 7, further comprising:
prior to the siliciding, forming a hard mask layer over the gate layer, wherein the forming the opening in the gate layer is performed such that the opening is formed through the hard mask layer.

9. The method of claim 1, wherein the gate layer comprises polysilicon.

10. The method of claim 9, further comprising:
forming a gate dielectric layer over the semiconductor substrate, wherein the gate layer is formed over the gate dielectric layer;
wherein the replacing the first patterned gate layer portion with a logic gate comprising metal comprises:
removing the first patterned gate layer portion and the gate dielectric layer underlying the first patterned gate layer portion; and
replacing the gate dielectric layer underlying the first patterned gate layer portion and the first patterned gate layer portion with a second gate dielectric having a high dielectric constant and the logic gate.

11. The method of claim 1, wherein the forming the opening in the gate layer is performed such that the opening extends into the semiconductor substrate.

12. The method of claim 1, further comprising:
replacing the second patterned gate layer portion with a select gate comprising metal.

13. The method of claim 1, wherein the replacing the first patterned gate layer portion comprises:
removing the first patterned gate layer portion resulting in a second opening and the second patterned gate layer portion resulting in a third opening;
forming a high-k dielectric layer in the second opening and the third opening; and
forming a metal layer in the second opening and the third opening.

14. A method of forming a semiconductor device in a non-volatile memory (NVM) region and in a logic region using a semiconductor substrate, comprising:
forming a first gate layer over the semiconductor substrate in the NVM region and the logic region;
forming a control gate opening in the first gate layer in the NVM region;
forming a charge storage layer in the control gate opening;
forming a control gate over the charge storage layer in the control gate opening, wherein the charge storage layer is between the control gate and a sidewall of the control gate opening and between the control gate and the semiconductor substrate;
forming a first masking portion having a first edge over the first gate layer and a second edge over at least one of the control gate and the charge storage layer;
using the first masking portion to pattern the first gate layer to form a first gate layer portion over the semiconductor substrate in the NVM region adjacent the control gate;
forming a second masking portion over the first gate layer in the logic region;
using the second masking portion to pattern the first gate layer to form a second gate layer portion over the semiconductor substrate in the logic region;
forming a dielectric layer over the semiconductor substrate, around the first gate layer portion, around the control gate, and around the second gate layer portion;
after the forming the dielectric layer, removing the first gate layer portion resulting in a logic gate opening; and
forming a metal logic gate in the logic gate opening.

15. The method of claim 14, further comprising:
during the removing the first gate layer portion, removing the second gate layer portion resulting in a select gate opening; and
forming a metal select gate in the select gate opening.

16. The method of claim 14, wherein the first masking portion and the second masking portion are part of the same patterned masking layer.

17. The method of claim 14, wherein the control gate comprises a metallic surface.

18. A method of forming a semiconductor device in a non-volatile memory (NVM) region and in a logic region using a semiconductor substrate, comprising:
forming a first gate layer over the semiconductor substrate in the NVM region and the logic region;
forming a control gate opening in the first gate layer in the NVM region;
forming a charge storage layer in the control gate opening;
forming a control gate over the charge storage layer in the control gate opening, wherein the charge storage layer is between the control gate and a sidewall of the control gate opening and between the control gate and the semiconductor substrate;
patterning the first gate layer to form a first patterned gate layer portion over the semiconductor substrate in the logic region and to form a second patterned gate layer portion over the semiconductor substrate in the NVM region, wherein the second patterned gate layer portion is adjacent the control gate;
forming a dielectric layer over the semiconductor substrate, around the first patterned gate layer portion, around the second patterned gate layer portion, and around the control gate;
after the forming the dielectric layer, removing the first patterned gate layer portion to form a logic gate opening in the dielectric layer and removing the second patterned gate layer portion to form a select gate opening in the dielectric layer; and forming a metal layer in the logic gate opening and the select gate opening to form a logic gate in the logic gate opening and a select gate in the select gate opening.

19. The method of claim 18, further comprising:

forming a second dielectric layer over the semiconductor substrate, wherein the first gate layer is formed over second dielectric layer, and wherein the removing the first patterned gate layer portion to form the logic gate and the removing the second patterned gate layer portion to form the select gate opening comprises removing portions of the second dielectric layer with the first and second patterned gate layer potions; and forming a high-k dielectric layer in the logic gate opening and the select gate opening, wherein the metal layer is formed over the high-k dielectric layer.

20. The method of claim 18, wherein the control gate comprises a metallic surface.

* * * * *